(12) United States Patent
Kawate

(10) Patent No.: US 6,908,318 B2
(45) Date of Patent: Jun. 21, 2005

(54) BATCH ELECTRICALLY CONNECTING SHEET

(75) Inventor: Kohichiro Kawate, Machida (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/484,175

(22) PCT Filed: Aug. 6, 2002

(86) PCT No.: PCT/US02/24790

§ 371 (c)(1),
(2), (4) Date: Jan. 15, 2004

(87) PCT Pub. No.: WO03/015218

PCT Pub. Date: Feb. 20, 2003

(65) Prior Publication Data

US 2004/0241402 A1 Dec. 2, 2004

(51) Int. Cl.[7] .............................. H01R 4/58; C09J 7/00
(52) U.S. Cl. ............................ 439/91; 439/83; 439/84; 439/387; 156/295; 156/306.6; 156/313
(58) Field of Search ............................ 439/63, 65, 74, 439/83, 84, 91, 387; 156/313, 306.6, 295

(56) References Cited

U.S. PATENT DOCUMENTS

| 4,449,774 | A | * | 5/1984 | Takashi et al. ............. 439/590 |
| 4,612,209 | A | | 9/1986 | Forgo et al. |
| 5,259,110 | A | * | 11/1993 | Bross et al. .................. 29/830 |
| 5,275,856 | A | * | 1/1994 | Calhoun et al. ........... 428/41.1 |
| 5,474,458 | A | * | 12/1995 | Vafi et al. ...................... 439/91 |
| 5,484,647 | A | * | 1/1996 | Nakatani et al. ............ 428/209 |
| 6,052,286 | A | * | 4/2000 | Worthen et al. ............ 361/765 |
| 6,093,476 | A | * | 7/2000 | Horiuchi et al. ............ 428/209 |
| 6,168,442 | B1 | * | 1/2001 | Naoi ........................... 439/91 |
| 6,465,084 | B1 | * | 10/2002 | Curcio et al. ............... 428/209 |
| 6,527,563 | B2 | * | 3/2003 | Clayton ....................... 439/66 |

FOREIGN PATENT DOCUMENTS

| EP | 0 083 503 | 7/1983 |
| EP | 0 223 464 | 5/1987 |
| EP | 0 237 176 | 9/1987 |
| GB | 902567 | 8/1962 |
| GB | 1 247 016 | 9/1971 |
| JP | 62 227986 | 10/1987 |
| JP | 1-113480 | 5/1989 |
| JP | 1-309206 | 12/1989 |
| JP | 02-272076 | 11/1990 |
| JP | 05315473 | 11/1993 |
| JP | 7-16090 | 1/1995 |
| JP | 7-202418 | 4/1995 |
| JP | 7-202426 | 4/1995 |
| JP | 2000049275 | 2/2000 |
| WO | WO 94/24704 | 10/1994 |

OTHER PUBLICATIONS

Tadashi Ashida et al., "Structure and adhesive properties of epoxy resins modified with core/shell acrylic particles", J. Adhesion Sci. Technol., vol. 12, No. 7, pp. 749–761 (1998).

* cited by examiner

Primary Examiner—Cathy F. Lam
(74) Attorney, Agent, or Firm—Melanie G. Gover

(57) ABSTRACT

A batch electrically connecting sheet makes it possible to form an electric connection with mechanical, thermal, and electrical stability at plural points of contact. A batch electrically connecting sheet comprises a heat-resistant sheet having plural perforations, conductive blocks, inserted in the perforations, having ridges including indentations and projections; the projections are outstanding from the perforations, and the conductive blocks are thicker than the heat-resistant sheet, and the heat-resistant sheet has an adhesive layer composed of a heat curable adhesive agent applied on at least one surface thereof, covering the projections of the conductive blocks.

7 Claims, 3 Drawing Sheets

BATCH ELECTRICALLY CONNECTING SHEET

TECHNICAL FIELD

The present invention relates to a heat curable conductive adhesive sheet used when a wiring pattern or the like of an electric circuit is connected, particularly to a batch electrically connecting sheet for connecting plural contact points of a wiring pattern of an electric circuit electrically in a batch manner.

DESCRIPTION OF THE RELATED ART

When making electric connections of large-current circuits, grounding of printed wiring boards, connection of battery electrodes, and electric connection of microwave printed wiring boards to heat sinks, housings or the like, it is necessary that the connections be mechanically, thermally and electrically stable.

In recent years, electronic parts on which electronic circuits integrated at a high density are mounted are used as electronic apparatus continue to be made smaller and lighter. Usually, electronic circuits control electronic apparatus, using high-frequency signals. High frequency signals are easily affected external minute noises, and the signals may result in malfunction of electronic apparatus. To remove such noises, it is necessary to perform shielding, grounding or the like. It is required to form electric connection having a low resistance easily and surely.

Several conductive materials suitable for connecting a wiring pattern or other electric circuits are suggested. However, considering the tendency to make electronic apparatus smaller and lighter in size, typical examples thereof are conductive adhesive agents and metal foil tapes.

Japanese Patent Laid-Open Publication No.H1(1989)-113480 and Japanese Patent Laid-Open Publication No.H1(1989)-309206 disclose conductive adhesive agents wherein conductive particles are dispersed in a heat curable resin. The conductive adhesive agents cause the conductive particles in the heat curable resin to contact each other by heat-curing the adhesive agent under pressure of the heat curable resin, to give electric conductivity. The contact between the conductive particles is in general a point-contact, i.e., the conductive particles are electrically connected to each other in a very small contact area. The conductivity of the conductive adhesive agents in such a case is easily affected by environmental changes, and is therefore poor in stability. It is also difficult to heat-cure the agents under pressure, using only simple equipment such as an ordinary oven. A special tool for pressing contact points upon the heat-curing is necessary, and the execution step is complicated.

Further, when a large electric current is sent thereto, heat may be generated at portions of contact points since there is a large contact resistance. When specific conductive particles, namely metal plated macromolecular particles, are used, the contact area can be made larger to some extent. However, the conductive layer is very thin; therefore, the problem of heat-generation may still exist. For example, when a large electric power of 100 W or more is continuously applied to an electric connection based on such a conductive adhesive agent, Joule heat is generated to such a degree that it negatively effects surrounding electronic parts.

On the other hand, the metal foil tape is a conductive pressure-sensitive adhesive sheet composed basically of a metal foil and a pressure-sensitive adhesive layer. In the case of an embossed metal foil tape wherein hollow projections are fitted to a metal foil tape by an embossing process, the hollow projections break through the pressure-sensitive adhesive layer to contact an object to be adhered electrically and directly. By deformation of the hollow projections, a relatively large contact area can be ensured. As a result, the conductivity of the metal foil tape is more stable than that of the conductive adhesive agent.

However, in the case of the metal foil tape, the pressure-sensitive adhesive layer is generally made of an acrylic pressure-sensitive adhesive agent and has poor adhesion at elevated temperatures and limited heat resistance. When a large electric current is sent thereto, the layer may be easily stripped from the object to be adhered by Joule heat. Thus, the thermal stability and the mechanical strength of connection are poor.

Thus, the electrical connection for sending a large electric current must rely on a mechanical caulk, as disclosed in Japanese Patent Publication H7(1995)-16090, or welding. Complicated operation is required for execution. Furthermore, when plural contact points are formed, it is necessary that connecting operation is performed for each of the contact points. A great deal of labor is required.

The present invention is an invention for solving the above-mentioned problems. An object thereof is to provide a batch electrically connecting sheet which makes it possible to form a low-resistance electric connection with mechanical, thermal and electrical stability at plural points of contact by a simple procedure.

SUMMARY OF THE INVENTION

The present invention is a batch electrically connecting sheet comprising a heat-resistant sheet having plural perforations, conductive blocks, inserted in the perforations having ridges including indentations and projections outstanding from the perforations. The conductive blocks are thicker than the heat-resistant sheet, and an adhesive layer composed of a heat curable adhesive agent applied on at least one surface of the heat-resistant sheet, the surface covering the projections of the conductive blocks.

The term "batch electrically connecting sheet" means a sheet which electrically connects at multiple points.

DESCRIPTION OF REFERENCE NUMERALS

Figure 1:
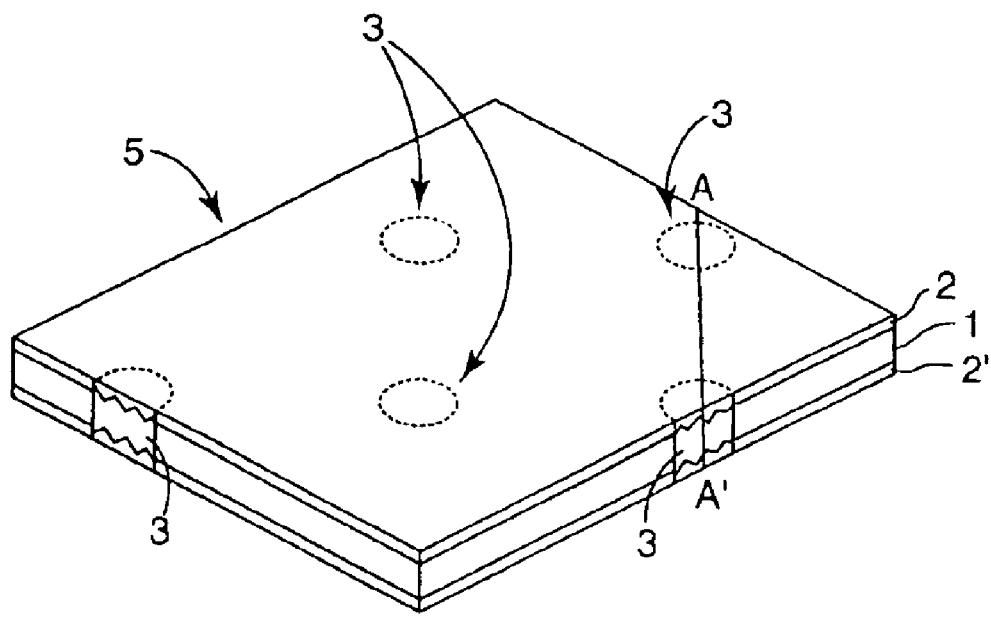
FIG. 1 is a perspective view illustrating an example of the batch electrically connecting sheet of the present invention.

1 . . . heat-resistant sheet,
2, 2' . . . adhesive layer,
3 . . . conductive block,
4, 4' . . . projections,
5 . . . batch electrically connecting sheet,
6, 6' . . . conductive object to be adhered.

DETAILED DESCRIPTION OF THE INVENTION

The present invention will be described according to preferred embodiments. In the drawings, the same reference numbers are attached to the same parts or the corresponding parts.

Figure 2:
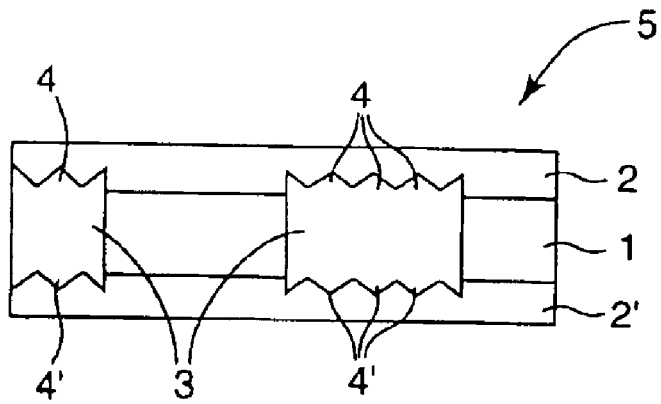
FIG. 2 is an AA' sectional view of the batch electrically connecting sheet of FIG. 1.

FIG. 1 is a perspective view illustrating an example of the batch electrically connecting sheet of the present invention. Correspondingly to the positions of contact points of a conductive object to be adhered, plural conductive blocks 3 are formed. The arrangement of the conductive blocks 3 may be regular or irregular. FIG. 2 is an AA' sectional view of the batch electrically connecting sheet, This batch electrically connecting sheet 5 has a heat-resistant sheet 1, an adhesive layer 2 applied on the front surface of the heat-resistant sheet 1, and an adhesive layer 2' applied on the rear surface of the heat-resistant sheet. In the heat-resistant sheet, perforations are made correspondingly to the positions of contact points of an object to be adhered. Conductive blocks 3 are inserted into the perforations. The conductive blocks 3, are thicker than the heat-resistant sheet used so that the blocks can contact the contact points of the abject to be adhered when the blocks are subsequently sandwiched between the objects to be adhered and then adhered to the objects under pressure. At this time, it is preferred that the blocks 3 have ridges constituting indentations and projections 4 which protrude from the front surface and the rear surface so that the blocks can easily pierce the adhesive layer to contact the object to be adhered.

The heat-resistant sheet should be formed from a material having strength, flexibility, and heat resistance having such a degree that can resist the curing temperature of the heat curable adhesive agent. In general, a film of a heat resistance polymer is preferably used as the heat-resistant sheet. Particularly preferred examples of the polymer include polyimide, polyester, polyphenylene ether, polyether imide, polyarylate, polyether sulfone, and polyphenylene sulfide.

The thickness of the heat-resistant sheet is not particularly limited, and is usually from 1 to 2000 µm, preferably from 10 to 1000 µm, and more preferably from 20 to 100 µm. If this heat-resistant sheet has a thickness of less than about 1 µm, the insulating reliability of insulated portions is poor. If the sheet has a thickness of more than about 2000 µm, flexibility becomes poor so that handling becomes inconvenient.

The perforations in the heat-resistant sheet can be manufactured by punching the sheet, or by other means such as laser ablation. One or more perforation(s) may be formed in the sheet. The planar shape of the perforations is usually circular, but is not particularly limited. If necessary, the shape may be polygonal, linear, curved or the like. The size of the perforations may be decided dependently on the size of the conductive object to be adhered, and is not particularly limited. Usually, about the size of the perforations, the perforation diameter is from 0.01 to 10 mm, preferably from 0.1 to 5 mm.

The material of the conductive blocks inserted into the perforations is not particularly limited. However, considering thermal conductivity as well as electric conductivity, a preferred conductive block is made of iron, stainless steel, silver, aluminum, nickel, tin or copper. Copper, iron and aluminum are particularly preferred due to cost considerations. The conductive block may be subjected to plating made of gold, tin, solder, silver, zinc, nickel or the like.

The planar shape of the conductive block is usually made to a shape corresponding to the perforations. The thickness of the conductive blocks, which includes that of the projections present in the ridges, is about 105 to 200%, preferably about 110 to 150% of the thickness of the heat-resistant sheet. If the thickness of the conductive block is less than 104% of that of the heat-resistant sheet, the contact between the conductive block and the contact point of the conductive object to be adhered becomes incomplete. If the thickness is more than 300%, the conductive blocks may not insert well in the heat-resistant sheet.

The conductive blocks have a ridged surface including projections 4 and 4', formed in both the front surface and the rear surface of the conductive block, respectively. The shape of these projections 4 and 4' is not particularly limited. The projections may be in a conical, pillar, mesa form or a lattice form to protrude partially. Alternatively, the front surface and the rear surface of the conductive blocks may undulate to form indentations and projections 4 and 4'.

The number of the projections formed on the surface of the conductive blocks is not particularly limited, and is generally from 1 to 1000 per $mm^2$, and preferably from 10 to 1000 per $mm^2$.

The size of the projections, i.e., the height is from 1 to 2000 µm and the average diameter thereof is from 10 to 20000 µm. If the height or the average diameter is below the lower limit thereof, the surface of the conductive object to be adhered and the difference between the projections become similar so that contact trends to be unstable. If the height and the average diameter are over the upper limit thereof, great pressure is required for crushing the projections at the time of connection. Considering the case in which an ordinary conductive object to be adhered is used to use a press machine of I ton or less, preferred height and average diameter are from 10 to 200 µm and from 100 to 5000 µm, respectively.

Particularly in the case in which the conductive object to be adhered is a high-frequency printed board such as a microwave printed wiring board, the average diameter of the projections is preferably set to not more than ½ of the wavelength of the above-mentioned high-frequency. If the interval between the projections is over ½ of the above-mentioned high-frequency, a conductive area surrounding non-contact portions functions as an antenna so that a risk of causing noises may be generated.

Metal materials are generally superior in malleability and ductility, and can easily be processed into a sheet form. About metals, the surface thereof is easily ridged or undulated by an embossing process. Accordingly, in the case in which metal is used as the conductive blocks, the conductive blocks are easily formed by punching out a metal sheet into a shape corresponding to the perforations and subsequently the surface thereof is subjected to an embossing process.

Considering that sufficient adhesive strength is obtained and simultaneously the contact between the heat-resistant sheet 1 and the conductive object to be adhered (non-illustrated) is made easy, the adhesive layers 2 and 2' usually have a thickness of 1 to 100 μm, preferably from 5 to 50 μm, and more preferably from 10 to 40 μm, and are arranged on both surfaces of the heat-resistant sheet 1.

The adhesive layer is formed from a heat curable adhesive agent. A preferred example of the heat curable adhesive layer is formed from a heat curable resin composition containing the following components:

(1) epoxy resin,
(2) a curing agent for the epoxy resin, and
(3) phenoxy resin.

The heat curable adhesive agent does not have tackiness substantially.

The epoxy resin reacts with the curing agent at a raised temperature or ambient temperature, so as to make it possible to form a cured product having a three-dimensional network structure. In this case, the cured product of the epoxy resin is superior in heat resistance and the like, and gives cohesive power to the adhesive layer so that objects to be adhered can be adhered to each other. As a result, the adhesive layer, which is different from the metal foil tape mentioned in the column of the prior art, is not easily stripped from the adhered conductive object even if Joule heat is applied to the layer by sending an electric current to the electric connection between conductive object to be adhered.

The type of epoxy resin is not particularly limited if the resin has heat resistance, cohesive power and so on. Examples of useful epoxy resins include bisphenol A type epoxy resin, bisphenol F type epoxy resin, phenol Novolak type epoxy resin, cresol Novolak type epoxy resin, fluorene epoxy resin, glycidylarnine resin, aliphatic epoxy, polycaprolactone modified epoxy, brominated epoxy, and fluorinated epoxies.

The epoxy resin is usually contained at a level of 5 to 80% by weight in this composition. If the content by percentage of the epoxy resin therein is less than 5% by weight, the heat resistance of the composition deteriorates. On the other hand, if the content of the epoxy resin therein is more than 80% by weight, there is a tendency for the cohesive power of the composition deteriorates and a great fluidity is given to the composition. Preferably, the epoxy resin is contained at a level of 10 to 50% by weight therein.

The curing agent is further added to the composition. At a raised temperature or ambient temperature, the curing agent reacts with the epoxy resin to cure the composition thermally. The type of the curing agent is not particularly limited as far as the agent can cure the composition thermally as described above. Useful curing agents include: an amine curing agent, acid anhydride, dicyanarnide, imidazole, cationic polymerization catalysts, hydrazine compounds and the like. Dicyandiamide is particularly preferred from the viewpoint of thermal stability thereof at a room temperature (30° C).

The curing agent is contained at a level of 0.1 to 30% by weight in this composition. If the content by weight of the curing agent therein is less than 0.1% by weight, the hardness of the composition deteriorates. If the content of the curing agent therein is more than 30% by weight, the property of the heat curable resin after heat-curing trends to deteriorate. Preferably, the curing agent is contained at a level of 0.5 to 10% by weight therein.

The phenoxy resin is a thermoplastic resin having a chain structure, a typical weight-average molecular weight of 2000 to 2000,000 or a number-average molecular weight of 10000 to 1000,000 and an epoxy equivalent of 500 to 500,000, and is film-forming. The phenoxy resin has a structure similar to that of the above-mentioned epoxy resin and is compatible with it. This composition itself is shaped to be made up to an adhesive agent film. It is particularly preferred to use the phenoxy resin together with bisphenol A type epoxy resin or fluorene epoxy resin. This is because bispheno A type epoxy resin or fluorene epoxy resin has very good compatibility with the phenoxy resin.

According to the present invention, the adhesive layer has a minimum storage shear modulus of 100,000 Pa or less, preferably 10 to 100,000 Pa, considering unintended flowing-out of the resin. This is because when the conductive objects to be adhered are bonded to each other using a pressure of $10^4$ to $5 \times 10^7$ Pa at a temperature of 60 to 260° C., such an adhesive layer allows the projections to pierce the adhesive layers and electric connection based on a low resistance between them is relatively easily provided.

On the other hand, if the minimum storage shear modulus is more than about 100,000, a very large pressure is necessary in order that the projections pierce the adhesive layer. Thus, the pressing becomes difficult. The storage shear modulus (G') in the present specification is a minimum value when a dynamic viscoelasticity meter (for example, "RDA II" manufactured by Reometrics Co.) is used to measure the shear modulus at an angular velocity of 6.28 rad/sec (frequency of 1 HZ) while the temperature is raised from 60 to 260° C. at a rate of 5° C. per minute.

The adhesive layer may be formed of a composition containing a bismaleimide resin instead of the epoxy resin, or a composition wherein bismaleimide resin is added along with the epoxy resin. Alternatively, it is allowable to use various "super engineering" plastics, e.g., polyhydroxyether obtained by reacting fluorene bisphenol with epoxy resin, or other thermoplastic resins. Polyhydroxy ether into which the above-mentioned fluorene backbone is introduced particularly improves the heat resistance of the adhesive resin layer and gives the water resistance.

The heat curable resin layer may be made of a composition mainly comprising epoxy resin, bismaleimide resin or a mixture thereof, and a without departing from the object and the effect of the present invention. A heat curable resin formed mainly from ethylene-glycidyl methacrylate is low in water absorption. Thus, the resin is suitable for use under conditions having high humidity. Since the resin is also chemically stable, it is suitable for, e.g., the protection of an electrode of a nickel-hydrogen battery or a lithium battery.

The interval between the conductive blocks is not particularly limited, and is usually from 0.1 to 200 mm. If the interval between the conductive blocks is below the lower limit thereof, a short circuit may be caused. If the interval between the conductive blocks is over the upper limit thereof, merits of connection in a batch manner becomes poor (the blocks may be separately pressed). based on solder is used together, a flux agent made of rosin or the like may be applied to the surface of the adhesive layer in order to make the solder connection easy. The batch electrically connecting sheet may be cut off into several areas which are electrically separated to each other after the formation of the adhesive layer.

Figure 3:
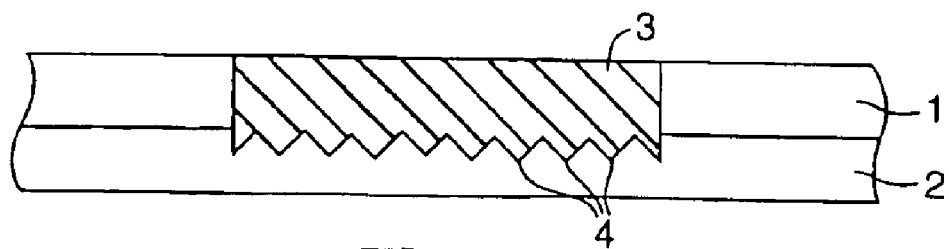
FIG. 3 is a sectional view illustrating an example of the batch electrically connecting sheet of the present invention.

In the above-mentioned batch electrically connecting sheet, indentions and projections are disposed on both surfaces of the conductive blocks, and the adhesive layer is disposed on both surfaces of the batch electrically connecting sheet. However, these may be disposed on only a single surface thereof. FIG. 3 is a sectional view of such a batch electrically connecting sheet.

Figure 4:
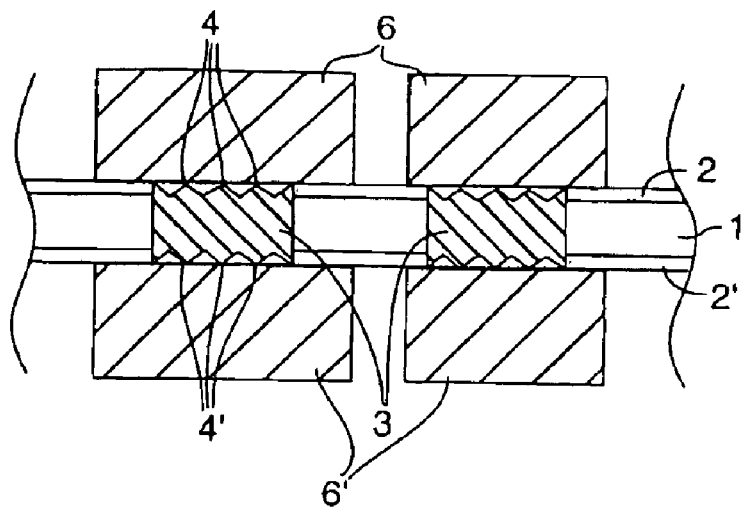
FIG. 4 is a sectional view of a connecting structure made of the batch electrically connecting sheet of the present invention.

FIG. 4 is a sectional view of a connecting structure made of a batch electrically connecting sheet of the present invention.

The connecting structure of the present invention is provided with a heat-resistant sheet 1, conductive blocks 3 inserted into portions thereof, conductive objects 6 and 6' to be adhered, which are set on and beneath the conductive blocks 3, and an adhesive layer 2 filled into a space between the conductive blocks 3 and the conductive objects 6 and 6' to be adhered. The adhesive layers 2 and 2' are bonded to the conductive objects 6 and 6' to be adhered, and projections 4 and 4' pierce the adhesive layer 2 to contact the conductive objects 6 and 6' to be adhered. As a result, in the case in which the conductive objects to be adhered have electrical conductivity, the batch electrically connecting sheet forms an electric connection between them to have a low resistance.

Figure 5A:
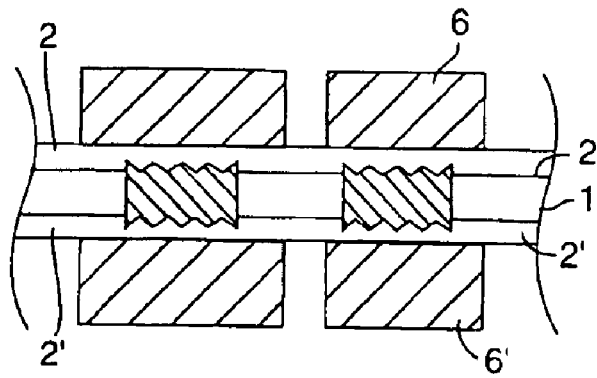
FIGS. 5a and 5b are process drawings which schematically illustrate a process of forming an electric connection from the batch electrically connecting sheet of the present invention.
Figure 5B:
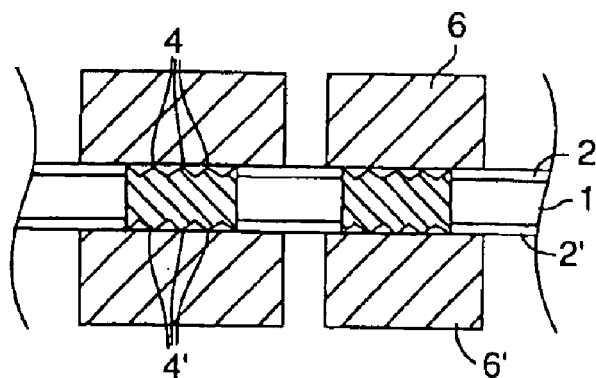

FIG. 5 are process drawings which schematically illustrate a process of forming an electrical connection by a batch electrically connecting sheet of the present invention.

As illustrated in FIG. 5(a), conductive objects 6 and 6' to be adhered are firstly arranged on the adhesive layer of a batch electrically connecting sheet 5.

Next, a desired pressure is applied between the conductive objects to be adhered while the adhesive layers 2 and 2' of the batch electrically connecting sheet 5 are heated together with the conductive objects 6 and 6' to be adhered. As a result, the adhesive layers 2 and 2' are softened, and the projections 4 and 4' of the conductive block pierce the adhesive layer to contact the conductive objects 6 and 6' to be adhered. At this time, the tips of the projections 4 and 4' deform by the applied pressure so that the contact area between the projections and the conductive objects to be adhered increases (the deformation is not illustrated). As a result, the adhesive sheet can provide an electric connection having a low resistance and an excellent stability between the conductive objects to be adhered. Thereafter, the adhesive layer is further heated if necessary, so as to cure the heat curable adhesive agent completely.

Thereafter, a large electric current of 10 to 100,000 Å may be sent between the projections of the heat-resistant sheet and the conductive object to be adhered, to melt and bond the projections 4 and 4' and the conductive objects 6 and 6' to be adhered. If a brazing material such as solder, tin, zinc, aluminum, or a low melting point metal is present between the projections of the heat-resistant sheet and the conductive objects to be adhered, the temperature at the time of heating and bonding under pressure may be suitably adjusted, or a suitable quantity of electric current sent between the projections of the heat-resistant sheet and the conductive objects to be adhered to braze (solder etc.) the projections 4 and 4' and the conductive objects 6 and 6' to be adhered. By this means, connection between the projections 4 and 4' and the conductive objects 6 and 6' to be adhered becomes firm.

Specific examples of the conductive object to be adhered include conductive members of plate-form bodies such as a bus-bar and a print wiring board, and a rod-form or a line-form body such as an electric wire.

Figure 6:
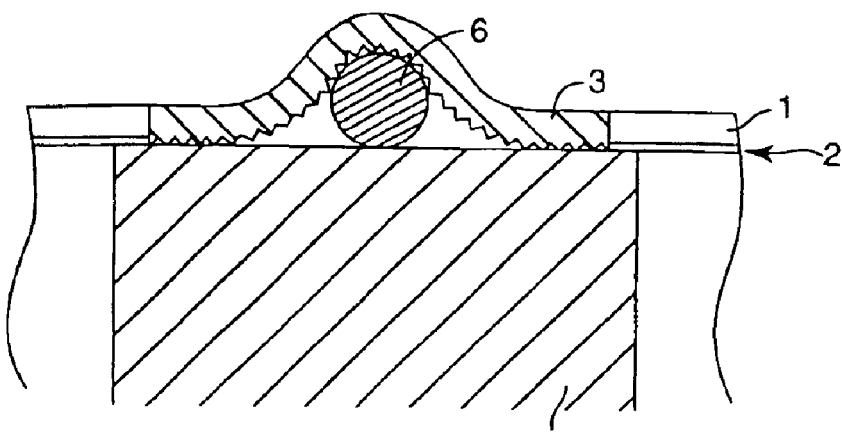
FIG. 6 is a sectional view of a connecting structure made of the batch electrically connecting sheet of the present invention.

FIG. 6 is a sectional view illustrating another example of the connecting structure of the present invention. In this example, a batch electrically connecting sheet wherein projections and an adhesive layer are disposed on a single surface is used. In the case in which a rod-form conductive member is placed on a plate-form conductive member, contact points of the two usually become a single line. As a result, the area where the two directly contact each other is small and the electric connection thereof becomes unstable. On the other hand, in the connecting structure of FIG. 6, the rod-form member 6 and the plate-form conductive member 6' ensure electric connection by direct contact between the two and the conductive member 3. As a result, sure electric connection between the rod-form conductive member 6 and the plate-form conductive member 6' becomes possible.

Figure 7:
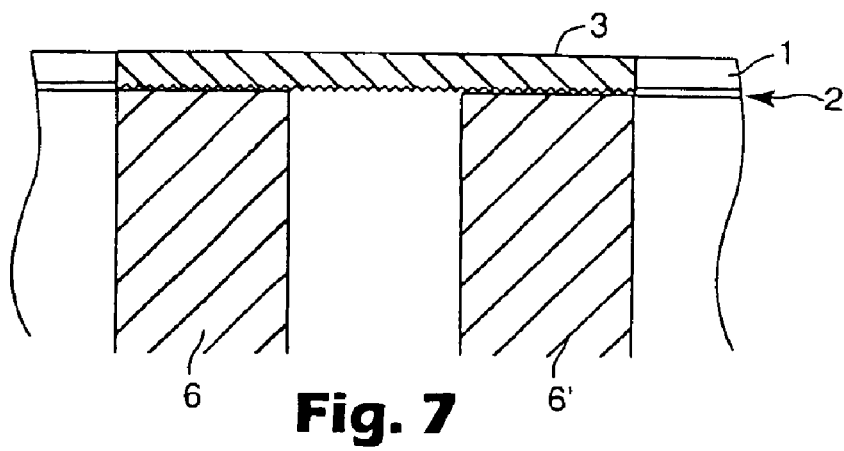
FIG. 7 is a sectional view of a connecting structure made of the batch electrically connecting sheet of the present invention.
Figure 8:
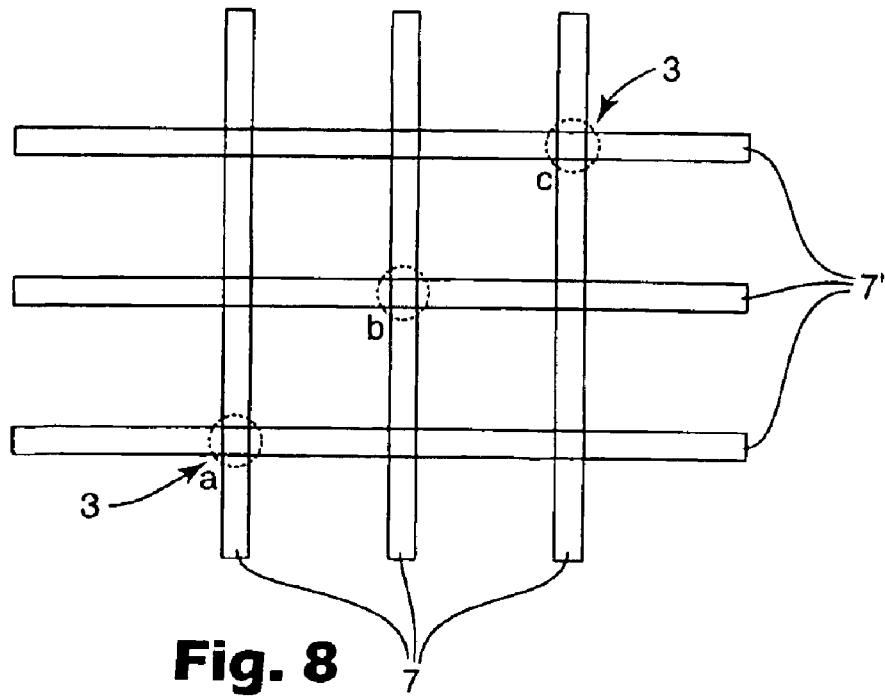
FIG. 8 is a plan view of an example of the embodiment wherein a batch electrically connecting sheet of the present invention is used to perform batch electric connection.

FIG. 7 is a further example illustrating the connecting structure of the present invention. An electric connection is formed between a conductive member 6 and a conductive member 6' on the same side to the batch electrically connecting sheet by a conductive member 3.

EXAMPLES

Example 1

Formation of an Adhesive Layer

A coating solution of a heat curable adhesive agent was obtained by mixing components shown in Table 1.

TABLE 1

| Component | Parts by weight |
|---|---|
| Phenoxy resin, "YP50S" made by Tohto Kasei Co., average number molecular weight = 11,800 | 30 |
| Epoxy resin, "DER332" made by Dow Chemical Japan Ltd., epoxy equivalent = 174 | 20 |
| Acrylic polymer dispersed epoxy resin, "Modiver RD102" made by Nippon Oil Co., Ltd., acryl content = 40% by weight | 20 |
| Epoxy resin, "PCL-G402" made by Daicel chemical Industries. Ltd., epoxy equivalent = 1350 | 30 |
| MEK sol of silica, "MEK-ST" made by Nissan Chemical Industries, Ltd., silica content = 30% by weight | 50 |
| Dicyandiamide | 2.9 |
| Toluene bisdimethylurea, "Omicure-24" made by PTI Japan Co. | 2.0 |
| Methanol | 40 |
| Methyl ethyl ketone | 40 |

The resultant coating composition was applied onto a polyethylene terephthalate (PET) film (thickness: 50 µm) subjected to stripping treatment, and the resultant was passed through an oven of 100 to 130° C. and dried to yield a film adhesive agent having a thickness of 50 µm.

Formation of Conductive Blocks

A copper foil ("C1020R-H" manufactured by Fukuda Kinzoku Hakufun Co.) having a thickness of 60 µm was punched out to form a disc having a diameter of 3.5 mm. This disc was sandwiched between two stainless steel net (SUS-304, 100 meshes), and pressed at a pressure of 156 kg/mm² to form an embossed copper foil.

Formation of a Batch Electrically Connecting Sheet

A polyimide film ("Eupilex" manufactured by Ube Industries, Ltd., thickness: 50 µm) having a thickness of 50 µm was punched out to form three through holes having a diameter of 3.8 mm. The film adhesive agent was stripped from the PET film, and placed on a single surface of the polyimide film. The resultant was heat-laminated with rollers of 100° C. Conductive blocks were inserted into the through holes made in the polyimlide film, and then a film adhesive agent was laminated on the other surface of the polyimide to confine the conductive blocks. In this way, a batch electrically connecting sheet was obtained.

Example 2

FIG. 5 is a plan view of an example of the embodiment wherein a batch electrically connecting sheet of the present invention is used to perform batch electric connection.

Formation of a Batch Electrically Connecting Structure

Three copper plates 7 having a size of 50×2×0.5 mm and subjected to tin plating were lined at intervals of 2 mm. The above-mentioned conductive sheet was placed thereon, and further the same three copper plates 7' as described above, were placed thereon so as to be perpendicular to the lower copper plates. At this time, the conductive blocks 3 of the conductive sheet were positioned between three points where the copper plates crossed each other, as illustrated in this figure.

The resultant lamination was pressed at 120° C. for 1 second to be temporarily fixed. Next, the lamination was pressed at 200° C. and 200 kgf for 14 seconds, so as to continue to apply pressure. A power source for welding machines ("Studmatic III YS-30" manufactured by Kabushiki Kaisha Yashima) was used to send an electric current to the electrically-connected copper plates for 1 second. Thereafter, the sample was cured in an oven of 200° C. for 5 minutes.

Measurement of Resistance

A digital micro ohmmeter ("34420A" manufactured by Azirent Technology Co.) was used to measure electric resistance against three contact points a, b and c of the lamination by a four-terminal method. The measurement results are as follows: a=0.006 milliohm, b=0.008 milliohm, and c=0.006 milliohm.

It was demonstrated as described above that in the batch electrically connecting structure of the present invention, electric connection having a low resistance and superior stability was provided between the conductive objects to be adhered.

According to the batch electrically connecting sheet of the present invention, it is possible to form an electric connection having a low resistance and mechanical, thermal and electrical stability at plural contact points.

What is claimed is:

1. A batch electrically connecting sheet comprising a heat-resistant sheet having a plurality of perforations, conductive blocks inserted in the perforations, said blocks having plurality of ridges including indentations and projections wherein the block is thicker than the heat-resistant sheet such that the projections outstand from the perforations, and an adhesive layer composed of a heat curable adhesive agent applied on at least one surface of the heat-resistant sheet covering the projections of the conductive blocks.

2. The batch electrically connecting sheet according to claim 1 wherein the conductive block is formed of a metallic material, and the projections are formed by an embossing process.

3. The batch electrically connecting sheet according to claim 1 wherein said adhesive layer is applied to both surfaces of the heat-resistant sheet covering a front surface and a back surface of the conductive blocks.

4. A process for batch electrically connecting comprising the steps of:

placing a conductive object to be adhered on each adhesive layer of the batch electrically connecting sheet according to claim 3; and heating the adhesive layers of the batch electrically connecting sheet while applying pressure between the batch electrically connecting sheet and conductive objects to be adhered, wherein the adhesive layers are pierced through by the projections of the conductive blocks, thereby bringing into contact the front surface and back surface of the conductive blocks with the conductive objects to be adhered.

5. The process according to claim 4, further comprising the step of applying electric current between the conductive blocks and the conductive object to be adhered, welding the projections of the conductive blocks with the conductive object to be adhered.

6. The process according to claim 4, further comprising the step of applying heat energy between the conductive blocks and the conductive object to be adhered so as to weld the projections of the conductive blocks with the conductive object to be adhered.

7. A connected structure comprising the batch electrically connecting sheet according to claim 1 and a conductive object to be adhered placed on the adhesive layer of the batch electrically connecting sheet wherein:

the adhesive layer adheres to the conductive object to be adhered; and the projections of the conductive blocks pierce through the adhesive layer and electrically contact with the conductive object to be adhered.

* * * * *

UNITED STATES PATENT AND TRADEMARK OFFICE
CERTIFICATE OF CORRECTION

PATENT NO. : 6,908,318 B2
DATED : June 21, 2005
INVENTOR(S) : Kawate, Kohichiro

It is certified that error appears in the above-identified patent and that said Letters Patent is hereby corrected as shown below:

Column 3,
Line 27, after "sheet" delete "," and insert -- . -- therefor.
Line 38, delete "abject" and insert -- object -- therefor.

Column 4,
Line 46, after "of" delete "I" and insert -- 1 -- therefor.

Column 5,
Line 34, delete "glycidylarnine" and insert -- glycidylamine -- therefor.
Line 53, delete "dicyanarnide" and insert -- dicyanamide -- therefor.

Column 6,
Line 9, delete "bispheno" and insert -- bisphenols -- therefor.

Column 8,
Line 59, delete "polyimlide" and insert -- polyimide -- therefor.

Signed and Sealed this

Thirtieth Day of August, 2005

JON W. DUDAS
*Director of the United States Patent and Trademark Office*